United States Patent
Sobaiti et al.

(10) Patent No.: US 7,275,188 B1
(45) Date of Patent: Sep. 25, 2007

(54) METHOD AND APPARATUS FOR BURN-IN OF SEMICONDUCTOR DEVICES

(75) Inventors: Moussa Sobaiti, Salinas, CA (US); Robert Shrank, Salinas, CA (US); Sudhakar Reddy, Milpitas, CA (US); Yousif Jirjis, Santa Clara, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 568 days.

(21) Appl. No.: 10/683,205

(22) Filed: Oct. 10, 2003

(51) Int. Cl.
*G11C 29/10* (2006.01)
*G11C 29/02* (2006.01)

(52) U.S. Cl. .................. 714/720; 714/42
(58) Field of Classification Search .......... 714/720, 714/718, 763, 42; 324/760; 365/200, 201
See application file for complete search history.

(56) References Cited

U.S. PATENT DOCUMENTS

| | | | |
|---|---|---|---|
| 4,298,891 A * | 11/1981 | Baba et al. | 348/568 |
| 5,085,471 A | 2/1992 | Ziu | |
| 5,373,509 A * | 12/1994 | Katsura | 714/719 |
| 5,375,091 A | 12/1994 | Berry, Jr. et al. | |
| 5,732,032 A | 3/1998 | Park et al. | |
| 5,790,564 A | 8/1998 | Adams et al. | |
| 5,798,653 A | 8/1998 | Leung, Jr. | |
| 5,917,764 A * | 6/1999 | Ohsawa et al. | 365/200 |
| 5,956,279 A | 9/1999 | Mo et al. | |
| 5,963,492 A * | 10/1999 | Hsu | 365/201 |
| 5,982,189 A | 11/1999 | Motika et al. | |
| 6,157,201 A | 12/2000 | Leung, Jr. | |
| 6,173,425 B1 | 1/2001 | Knaack et al. | |
| 6,175,774 B1 | 1/2001 | Frank et al. | |
| 6,185,139 B1 | 2/2001 | Pantelakis et al. | |
| 6,226,764 B1 | 5/2001 | Lee | |
| 6,233,184 B1 | 5/2001 | Barth et al. | |
| 6,326,800 B1 | 12/2001 | Kirihata | |
| 6,353,332 B1 * | 3/2002 | Brelet | 326/40 |
| 6,353,563 B1 | 3/2002 | Hii et al. | |
| 6,426,904 B2 | 7/2002 | Barth et al. | |
| 6,546,510 B1 | 4/2003 | Mazumder et al. | |
| 6,563,823 B1 * | 5/2003 | Przygienda et al. | 370/392 |
| 6,601,204 B1 * | 7/2003 | Tsuto | 714/739 |
| 2002/0121913 A1 * | 9/2002 | Miller et al. | 324/760 |
| 2003/0012069 A1 * | 1/2003 | Park et al. | 365/201 |
| 2003/0160319 A1 * | 8/2003 | Zheng et al. | 257/712 |

FOREIGN PATENT DOCUMENTS

EP 0805460 A1 11/1997

* cited by examiner

*Primary Examiner*—Guy Lamarre
*Assistant Examiner*—Dipakkumar Gandhi
(74) *Attorney, Agent, or Firm*—Kenneth Glass; Glass & Associates

(57) ABSTRACT

A method and apparatus for burn-in of semiconductor devices is disclosed. A semiconductor device that includes built-in self test circuitry is coupled to a socket on a burn-in board. The burn in board and the semiconductor device are heated. Burn-in instructions can be transmitted to the semiconductor device through a JTAG terminal of the semiconductor device. Upon receiving a burn-in instruction through a JTAG terminal, the built-in self test circuitry is operable to perform one or more burn-in function. This allows for burn-in of a semiconductor device without any transfer of data through the data input terminals of the semiconductor device.

12 Claims, 8 Drawing Sheets

METHOD AND APPARATUS FOR BURN-IN OF SEMICONDUCTOR DEVICES

FIELD OF THE INVENTION

The present invention relates to the field of semiconductor devices. More specifically, the present invention relates to burn-in and testing of semiconductor devices.

BACKGROUND ART

Burn-in operations are often performed on semiconductor devices to exercise and stress those circuits that may fail early in the product's life cycle. Conventional burn-in processes for devices that include memory arrays write data to each memory cell in the memory array. This is done using a socket that includes pins that electrically connect to each data input terminal of the memory array, and pins that electrically connect with other terminals required for the burn-in (e.g., power, ground, etc). This is a parallel process, with data transmitted in parallel to each data input terminal of each device under test.

The types of inexpensive sockets typically used in burn-in testing have been adequate in the past as there has not been a need to connect to a large number of pins on the packaged semiconductor device. However, the size of memory arrays keeps increasing, resulting in the need to connect to more and more input data terminals of each memory array. In order to assure good contact with all of the pins of the device under test more expensive sockets must be used, resulting in increased cost. Moreover, as the pin-count increases, reliability decreases and the time required to perform each burn-in increases. Also, the number of required connections is limited by the capabilities of the card-edge connector on the burn-in board that is used to connect to the burn-in driver. With the high number of pin counts of recent semiconductor devices this will result in the need to buy new connectors and/or the need to reduce the number of sockets on a particular burn-in board.

Most semiconductor devices that include memory arrays are now compliant with the Joint Test Action Group (JTAG) standard, formally known as IEEE/ANSI Standard 1149.1. This standard was originally developed as an on-chip test infrastructure to extend the lifetime of available automatic test equipment. Semiconductor devices that conform to the JTAG standard include a boundary scan cell that is connected to each input, output or bi-directional terminal. The JTAG circuitry is transparent during normal operation of the chip such that it does not interfere with normal operation of the chip. However, when the device is placed in the test mode, input signals can be captured for later analysis and output signals can be set to affect other devices on the board.

Accordingly, what is needed is a method and apparatus that will allow for burn-in of semiconductor devices having memory arrays. Also, a method and apparatus is needed that will allow for burn-in of JTAG-compliant devices. In addition, a method and apparatus is needed that will meet the above needs and that is less expensive and more reliable.

DISCLOSURE OF THE INVENTION

The present invention provides a method and apparatus that requires fewer pins for burn-in of semiconductor devices having memory arrays. This results in reduced cost and increased reliability.

A method for performing burn-in of a semiconductor device that includes JTAG terminals and that includes a memory array is disclosed. First, a semiconductor device is connected to a burn-in board. The semiconductor device is coupled to the burn-in board by placing the semiconductor device in a socket on the burn-in board such that the pins of the socket connect the circuitry of the burn-in board to corresponding circuitry on the semiconductor device. In one embodiment a burn-in board is used that includes a reduced pin-count socket. The reduced pin-count socket does not include pins that connect to data input terminals of the semiconductor device.

The semiconductor device and the burn-in board are heated. While the semiconductor device and the burn-in board are heated an instruction is sent to a JTAG terminal of the semiconductor device. In the present embodiment a semiconductor device is used that includes built-in self test circuitry. This built-in self test circuitry is operable, upon receiving the burn-in instruction through a JTAG terminal, to perform one or more burn-in function.

The present method does not require any data to be transmitted through data input terminals of the semiconductor device. Accordingly, the burn-in process of the present invention is not constrained by the size of the memory array of the device to be tested. Accordingly the apparatus and method of the present invention allow for burn-in of devices that include large memory arrays. Furthermore, significant cost savings are realized as reduced pin-count sockets can be used. In addition, as electrical contact is required with fewer pins than are required in prior art processes, reliability is improved.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should be understood as not being drawn to scale except if specifically noted.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
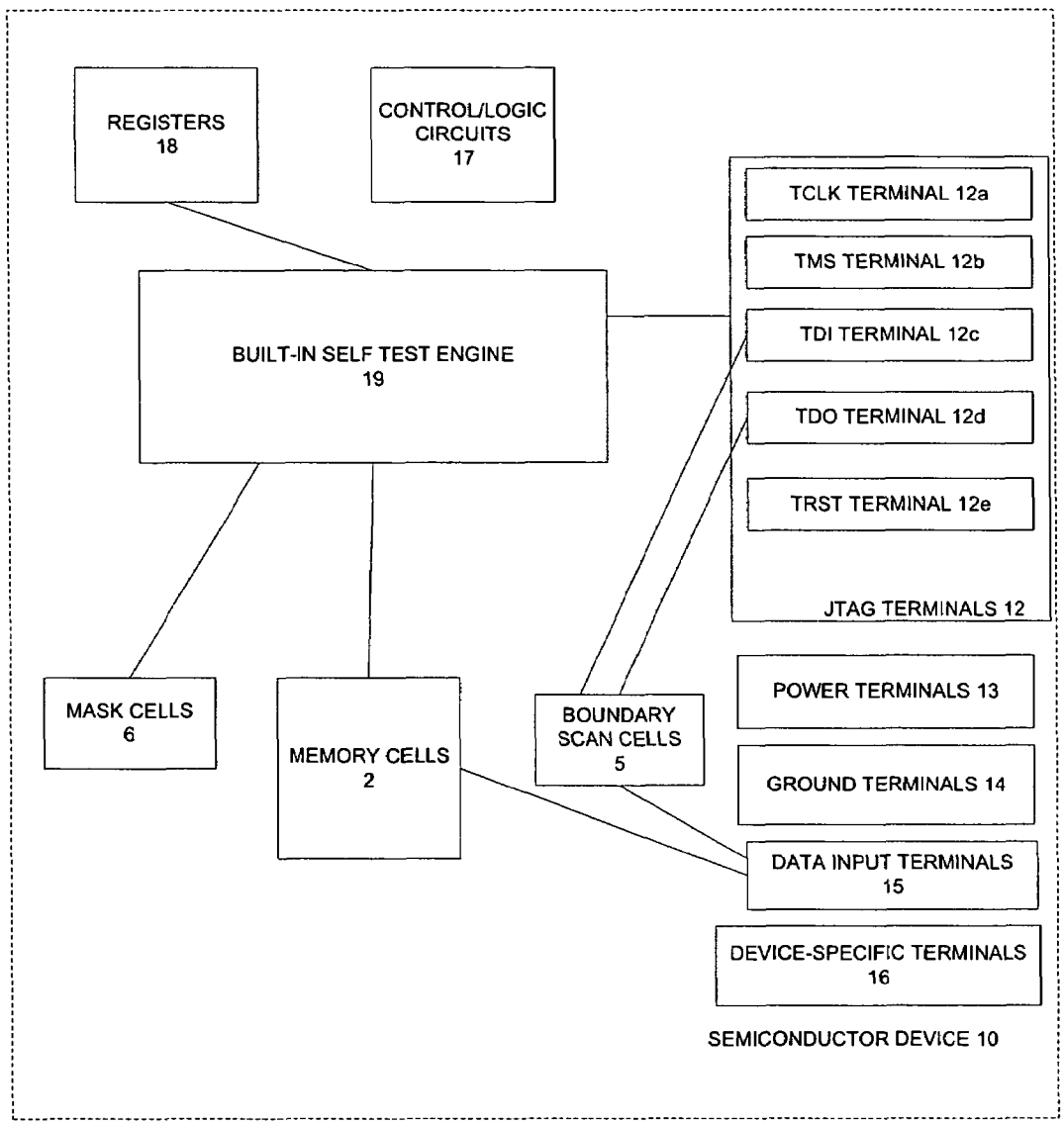
FIG. 1 is a diagram that illustrates a semiconductor device in accordance with one embodiment of the present invention.

FIG. 1 shows a semiconductor device 10 that includes a memory array of memory cells 2. Memory cells 2 can be SRAM cells, DRAM cells, NVRAM cells, or any other type of memory cell that is capable of storing data. Semiconductor device 10 also includes data input terminals 15 that are electrically coupled to memory cells 2. The term "data input terminals" as used in the present application specifically refers to those terminals that receive data for input into memory cells 2 during normal operation of semiconductor device 10. In the present embodiment data input terminals 15 are contact pads that are located on the top of semiconductor device 10 for coupling input to memory cells 2.

In one embodiment data input terminals 15 are the terminals of semiconductor device 10 that provide input to a request data bus. In the present embodiment data is received in parallel through data input terminals 15 and is transmitted to memory cells 2 via the request data bus. In one embodiment, the request data bus receives both data and addresses through data input terminals 15, with the addresses indicating where the associated data is to be stored.

Semiconductor device 10 includes boundary scan cells 5 which are connected to data input terminals 15. More particularly, a boundary scan cell 5 is electrically coupled to each data input terminal 15. Semiconductor device 10 also includes power terminals 13, ground terminals 14 and JTAG terminals 12. The term "JTAG terminals" as used in the present application includes those terminals (e.g., contact pads) of a semiconductor device that comply with, and are specified by a JTAG (IEEE 1149.x) standard including but not limited to the IEEE 1149.1 standard. Semiconductor device 10 also includes device-specific terminals 16. Device-specific terminals 16 include those terminals (other than JTAG terminals 12, power terminals 13 and ground terminals 14) that are required for operation of built-in self test engine 19.

In the present embodiment JTAG terminals 12 include Test Clock Input (TCLK) terminal 12a, Test Mode Select (TMS) terminal 12b, Test Data Input (TDI) terminal 12c, Test Data Output (TDO) terminal 12d, and Test Reset (TRST) terminal 12e. Test Data Output (TDO) terminal 12d is electrically coupled to boundary scan cells 5 for serial output of data from boundary scan cells 5. Test Data Input (TDI) terminal 12c allows for serial input of instructions as well as test and programming data. Test mode select (TMS) pin 12b is an input pin that provides state control of the test access port. Test clock input (TCLK) terminal 12a provides clock input to the JTAG circuitry. Test reset (TRST) terminal 12e allows for asynchronously resetting the boundary-scan circuit. It is appreciated that IEEE Standard 1149.1 provides that the use of a test reset input 12e is optional and that semiconductor device 10 does not have to include a test reset input terminal 12e.

Semiconductor device 10 also includes built-in self test engine 19. Built-in self test engine 19 includes circuitry that is operable upon receiving an instruction through a JTAG terminal 12 to perform a burn-in function. In the present embodiment, built-in self test engine 19 includes test circuitry that is programmable through the test access port and that is in conformance with IEEE 1149.1 standards. Also, in the present embodiment, built-in self test engine 19 includes additional circuits that are operable to perform self-test functions over and above those functions specified in IEEE 1149.1.

Built-in self test engine 19 also includes circuitry that is operable upon receiving a burn-in instruction at a JTAG terminal 12 to perform the indicated burn-in function. In the present embodiment, the circuitry of built-in self test engine 19 is operable upon receiving a burn-in instruction at TDI terminal 12c to perform the indicated burn-in function.

In one embodiment semiconductor device 10 is a Content Addressable Memory (CAM) device (e.g., a search engine) that stores data words in memory cells 2. During normal operation data values that are applied to data input terminals 15 are stored in memory cells 2. Control/logic circuits 17 are operable to compare a data value with all of the data words stored in memory cells 2 to determine whether or not there is a match. Because large amounts of data can be searched at the same time, CAM arrays are often much faster than RAM arrays in certain systems, such as, for example, search engines. Though semiconductor device 10 is described as being a CAM device in the present embodiment, it could also be any type of device that includes a memory array such as, for example, a DRAM device, SRAM device, NVRAM device, FIFO, single port memory device or multi-port memory device.

Figure 2:
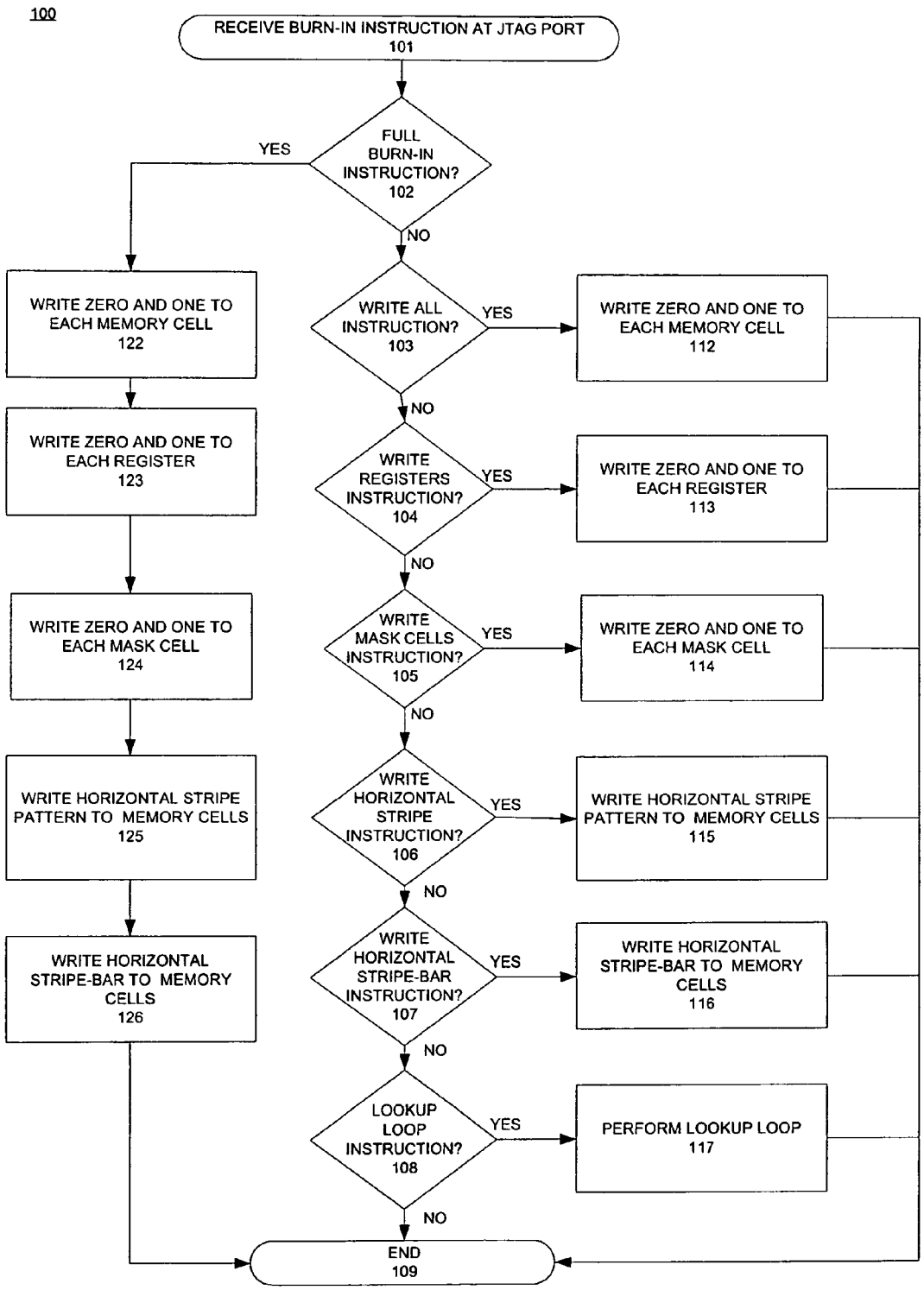
FIG. 2 is a flow chart that illustrates the operation of the semiconductor device of FIG. 1 in accordance with one embodiment of the present invention.

FIG. 2 illustrates an embodiment in which built-in self test engine 19 includes circuitry that is operable upon receiving instructions 102–108 to perform burn in functions 112–117 and 122–126. It is appreciated that the burn-in instructions and burn-in functions of FIG. 2 are exemplary and that semiconductor device 10 can perform other burn-in functions and can be operable upon receiving other burn-in instructions.

When a FULL BURN-IN instruction is received at a JTAG port (e.g., TDI terminal 12c), as shown by blocks 101–102, the circuitry of built in self-test engine 19 is operable to perform a full burn-in routine. In the present embodiment the burn-in routine includes each of the functions shown in steps 122–126. More particularly, a zero and a one are written to each memory cell as shown by step 122, a zero and a one are written to each register as shown by step 123, and a zero and a one are written to each mask cell as shown by step 124. A horizontal stripe pattern is then written to the memory cells as shown by step 125, and a horizontal stripe-bar pattern is written to the memory cells as shown by step 126. This full burn-in routine allows for full burn-in of a semiconductor device 10 using a single burn-in instruction.

When a WRITE-ALL instruction is received as shown by blocks 103 and 112, a zero and a one are written to each memory cell. More particularly, in the embodiment shown in FIG. 1, a zero and then a one are written to each memory cell 2. When a WRITE REGISTERS instruction is received as shown by blocks 104 and 113, a zero and a one are written to each register. More particularly, in the embodiment shown in FIG. 1, a zero and then a one are written to each memory location of each register 18.

When the semiconductor device includes mask cells, and when a WRITE MASK CELLS instruction is received as shown by blocks 105 and 114, a zero and a one are written to each mask cell. In the embodiment shown in FIG. 1, a zero and then a one are written to each mask cell 6.

When a WRITE HORIZONTAL STRIPE instruction is received, as shown by blocks 106 and 115, a horizontal stripe pattern is written to the memory cells. Similarly, when a WRITE HORIZONTAL STRIPE-BAR instruction is received, as shown by blocks 107 and 116, a horizontal stripe-bar pattern is written to the memory cells. When a LOOKUP LOOP instruction is received, as shown by blocks 108 and 117, a lookup loop is performed so as to cause alternating match lines to match and not match (this exercises the encoder logic of semiconductor 10).

It can be seen that the present invention allows for easily and flexibly performing a burn-in either using a single burn-in instruction that is operable to perform a full burn-in routine or by using multiple burn-in instructions, each of which are operable to perform a single burn-in function. In one embodiment semiconductor 10 is operable to perform multiple different full burn-in routines with each full burn-in routine being different. Accordingly, the present invention allows for burn-in operation to be easily changed by sending additional or different instructions through a JTAG terminal.

Figure 3:
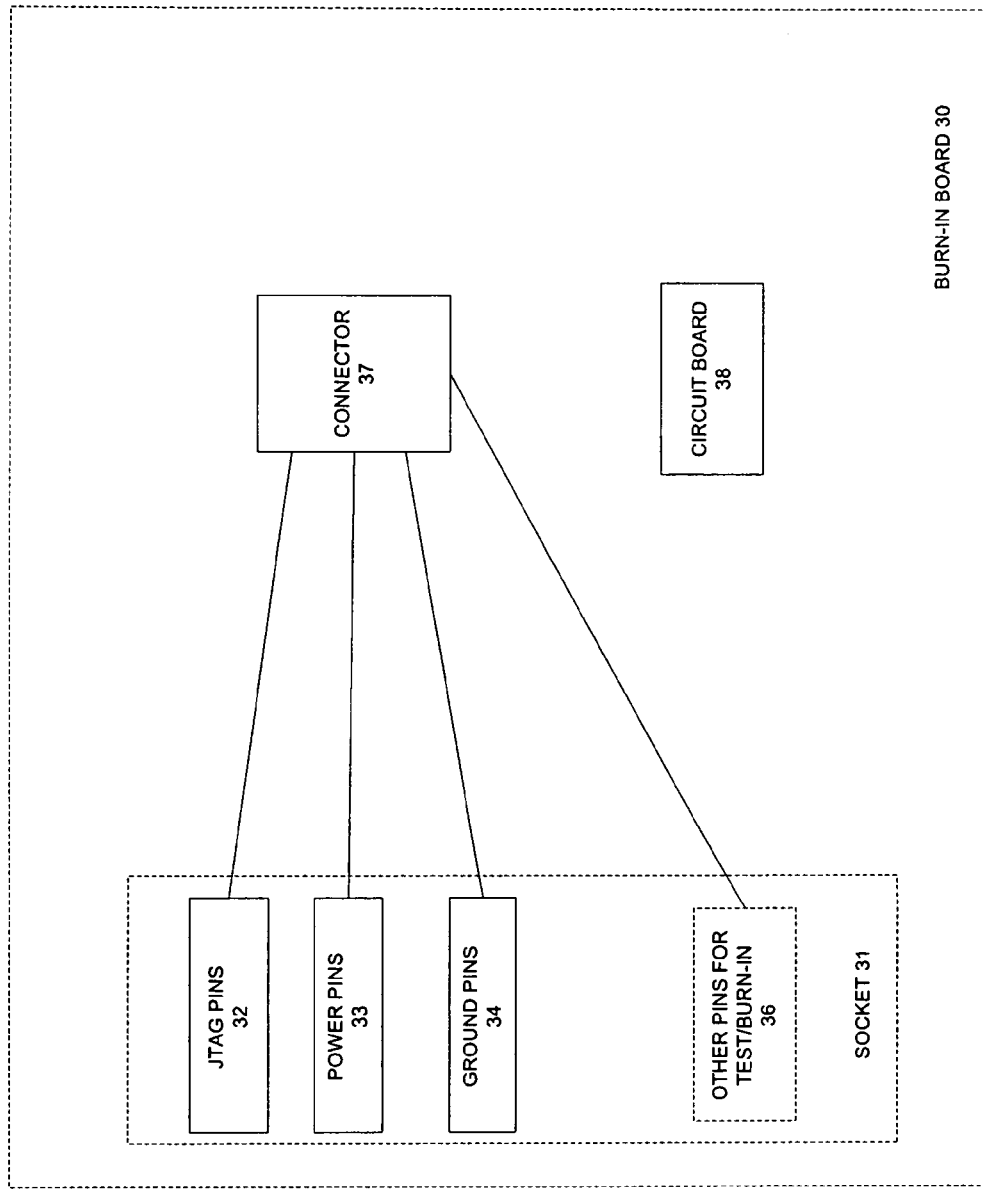
FIG. 3 is a diagram that illustrates a burn-in board in accordance with one embodiment of the present invention.

Referring now to FIG. 3, a burn-in board 30 is disclosed that can be used to perform burn-in of semiconductor device 10. Burn-in board includes socket 31 and connector 37 that are attached to circuit board 38. In the present embodiment connector 37 is a card edge connector that electrically couples to pins 32–34 and 36 by conductive traces on circuit board 38. Connector 37 allows for electrical connection to a burn-in driver. More particularly, connector 37 is adapted to receive a corresponding connector receptacle (e.g., a backplane in the burn-in oven) that is electrically connected to a burn-in driver.

In the present embodiment socket 31 is shown to include pins 32–34 and 36, which are adapted to couple to corresponding circuitry of the device under test (e.g., semiconductor device 10). In the present embodiment socket 31 includes JTAG pins 32 that couple to JTAG terminals 12; power pins 33 that couple to power terminals 13; and ground pins 34 that couple to ground terminals 14. In addition, socket 31 includes device-specific pins 36 that electrically couple to device-specific terminals 16. In the present embodiment, device-specific pins 36 are those pins that are required to be electrically connected to a corresponding device-specific terminal 16 in order to perform pre-test and burn-in of semiconductor device 10.

The term "pins" as used in the present application includes cylindrically-shaped structures made of electrically conductive material and also includes other shapes, structures, and mechanisms that allow for making an electrical connection to a corresponding electrical contact of the device under test. Accordingly, when the device under test is a pin grid array, the term "pins" as used in the present application includes conductive contacts that mate with individual pins of the device under test. Similarly, when the device under test is a ball grid array, the term "pins" includes conductive cylindrically shaped structures that make electrical contact with corresponding solder balls. Moreover, the term "pins" includes electrical connection mechanisms such as fuzzballs, springs, etc. that are adapted to make electrical contact with a corresponding conductive structure on a device under test.

In the embodiment illustrated in FIG. 3, a single socket 31 is illustrated. However in the present embodiment multiple sockets 31 are attached to the burn-in board and each socket 31 on the burn-in board is electrically connected to connector 37. This allows for multiple devices to be burned-in at the same time.

Socket 31 does not include pins for coupling to data input terminals (e.g., data input terminals 15) of the device under test. Therefore, burn-in board 30 has a reduced pin-count as compared to prior art burn-in boards. Moreover, as burn-in board 30 does not include pins for coupling to data input terminals, burn-in board 30 is not constrained by the size of the memory array of the device to be tested. Therefore, burn-in board 30 can be used to burn-in semiconductor devices that include large memory arrays. Also, significant cost savings are realized as reduced pin-count sockets 31 are less expensive than high pin-count sockets. In addition, burn-in board 30 requires electrical contact with fewer pins than are required in prior art processes. Accordingly, reliability of both pre-test and burn-in are improved.

Figure 4:
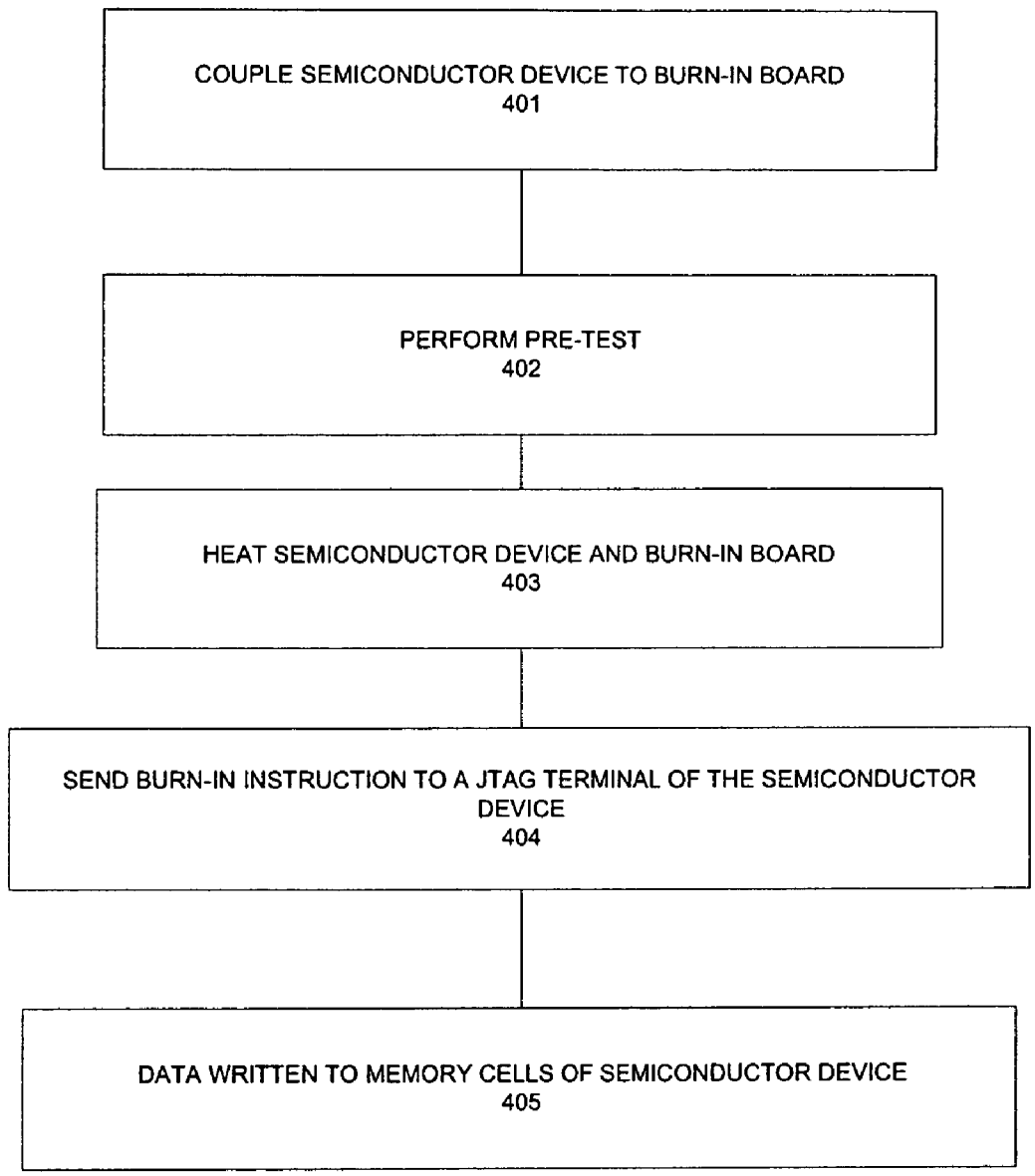
FIG. 4 is a flow chart that illustrates a method for performing burn-in of a semiconductor device in accordance with one embodiment of the present invention.

FIG. 4 illustrates a method 400 for performing burn-in of a semiconductor device. As shown by step 401 a semiconductor device is coupled to a burn-in board. In the present embodiment the semiconductor device is packaged, and the packaged semiconductor device (the device under test) is coupled to the burn-in board by inserting the packaged semiconductor device into a socket on the burn-in board.

Figure 5:
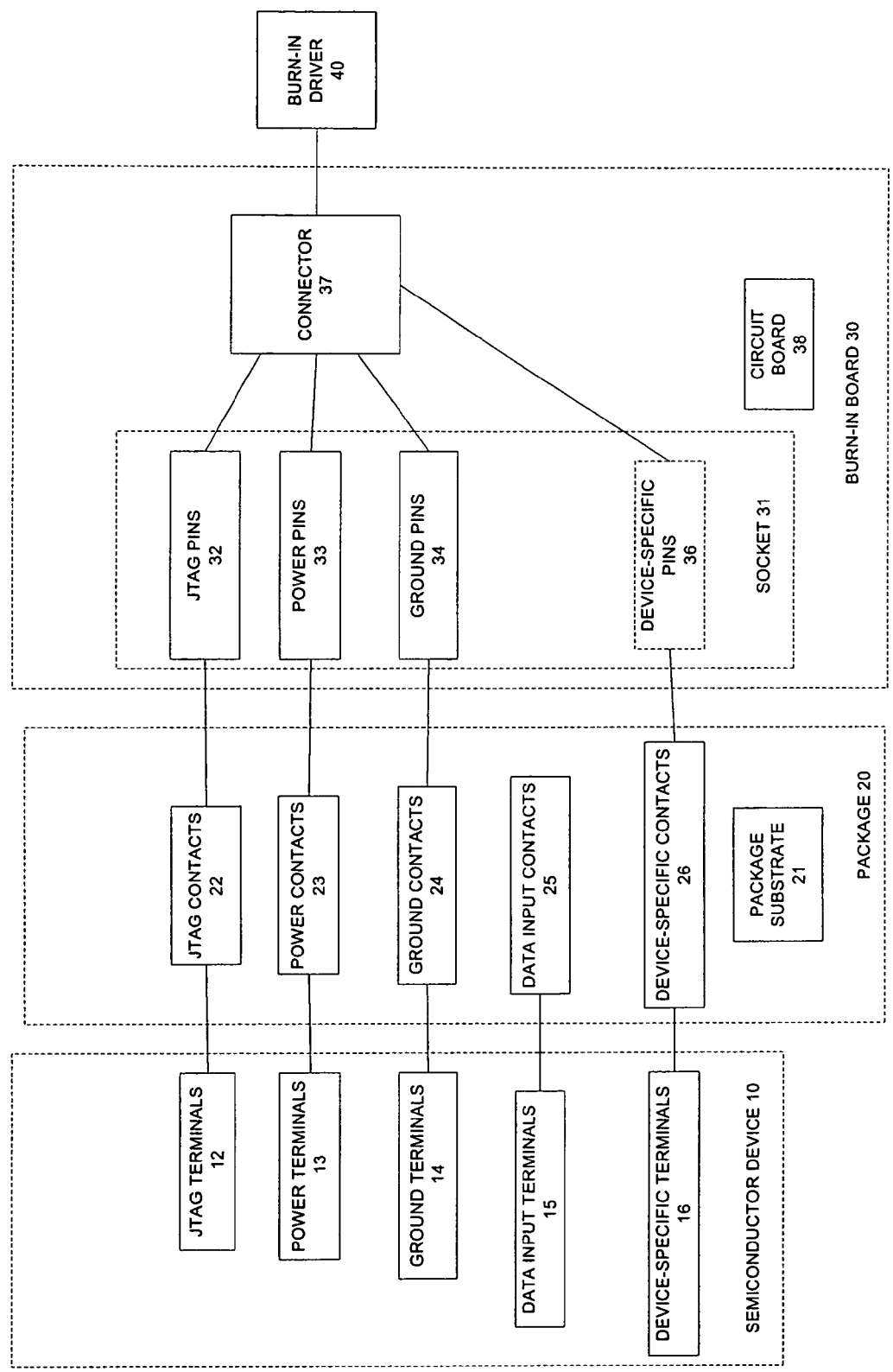
FIG. 5 is a diagram that illustrates how the terminals of a semiconductor device couple to a package, and how that package couples to a burn-in board and a burn-in driver in accordance with one embodiment of the present invention.

In the embodiment shown in FIG. 5 semiconductor device 10 is shown to be packaged using package 20. More particularly, semiconductor device 10 is attached to package 20 and terminals 12–16 are electrically connected (e.g., wire bonds) to corresponding contacts 22–26. The resulting packaged semiconductor device is inserted into socket 31 such that some of contacts 22–26 are electrically connected with corresponding pins 32–34 and 36 of socket 31.

Continuing with FIG. 5, in this embodiment package substrate 21 is a ball grid array package substrate, and socket 31 includes pins that are cylindrically shaped structures that make electrical contact with corresponding solder balls of package substrate 21. However, any of a number of other connection mechanisms could be used to connect contacts 22–24 and 26, to connector 37 (e.g., pin grid arrays, leads, etc.). Connector 37 electrically couples to burn-in driver 40. In the present embodiment burn-in driver 40 includes programmable integrated circuit devices (e.g., EPROM's). However, alternatively, burn-in driver 40 can be any instrument used for generating device input signals in a burn-in system.

In one embodiment a pre-test 402 is performed to determine whether the circuitry of the device under test is operating correctly. In the present embodiment this pre-test is performed by electrically coupling connector 37 to a pre-test station. The pre-test station sends one or more instructions to the built-in self test engine of the device. The built-in test engine, upon receiving the instructions, is operable to perform the desired testing operations. In an embodiment in which semiconductor device 10 is a CAM device, in order to assure that each memory cell of the CAM array will work, the pre-burn-in test is operable to test the circuitry and some or all of the memory cells of the CAM device. Once the testing operations are complete, the built-in self test engine sends one or more signals that indicate that the test is complete and that indicate whether or not the test was successful (e.g., through one of device-specific terminals 16 and/or TDO terminal 12*d*). When the pre-test indicates that the device under test is operating properly, the burn-in board is disconnected from the test station and the burn-in board is placed into a burn-in oven.

As shown by step 403 of FIG. 4, the semiconductor device and the burn-in board are heated. In the embodiment shown in FIG. 5 connector 37 is attached to a connector receptacle that is electrically connected (e.g., using a backplane in the burn-in oven) to burn-in driver 40. The oven is then turned on so as to heat burn-in board 30 and the attached semiconductor device 10.

Referring now to step 404 a burn-in instruction is sent to a JTAG terminal of the semiconductor device. In the embodiment shown in FIG. 5, the burn-in instruction is generated by burn-in driver 40 and passes through connector 37, through a JTAG pin 32, a JTAG contact 22 to a JTAG terminal 22. In the present embodiment the burn-in instruction is transmitted to semiconductor device 10 through TDI terminal 12*c*. While the burn-in test is being performed, contact is maintained with device-specific terminals 16, and with some of power terminals 13 and ground terminals 14.

In one embodiment a single instruction (e.g., a FULL BURN-IN instruction) is sent to semiconductor device 10 that instructs semiconductor device 10 to perform a full burn-in routine. Semiconductor device 10 is operable upon receiving this instruction to write data to each memory cell 2, write data to each register 18, write data to each mask cell 6, write a horizontal stripe pattern, and write a horizontal stripe-bar pattern.

In another embodiment some or all of the following burn-in instructions are sent from burn-in driver 40 to a JTAG terminal 12: WRITE-ALL, WRITE REGISTERS, WRITE MASK CELLS, WRITE HORIZONTAL STRIPE, WRITE HORIZONTAL STRIPE-BAR, and LOOKUP LOOP. Semiconductor device 10 is operable upon receiving the instructions to perform the indicated burn-in functions.

In the embodiment illustrated in FIG. 2, circuits of built-in self test engine 19 are operable to perform burn-in functions. However, alternatively, the device under test could include circuitry that is separate from that of the built-in self test engine (e.g., a burn-in engine) that is operable to receive instructions through a JTAG terminal and perform the indicated burn-in function.

In one embodiment the built-in self test circuits of the device under test generate pre-programmed data that is written to the semiconductor device during the burn-in function. Alternatively, the data that is written to the semiconductor device during the burn-in function is sent to the semiconductor device through a JTAG terminal. In one embodiment burn-in driver 40 of FIG. 5 is operable to send one or more burn-in instructions and to send data to be written during the burn-in function (e.g., a control word) to TDI terminal 12*c*. The built-in self test circuitry of semiconductor device 10 is then operable to perform the function indicated by the instruction using the received data.

In one embodiment all of the data and instructions required for performing burn-in are transmitted to the device under test via TDI terminal 12*c*. Accordingly, the data transfer is serial, passing from the burn-in driver 40, through a test data in JTAG pin 32, through a corresponding test data in JTAG contact 22, to TDI terminal 12*c*. This serial transfer of data and instructions allows for efficiently performing burn-in without the need to transfer data in parallel (e.g., over numerous data input terminals) as is required in prior art processes for performing burn-in.

In one embodiment semiconductor device 10 is operable upon receiving an electrical signal through one or more of device-specific terminals 16 to perform burn-in functions (e.g., burn-in functions 112–117 or 122–126). More particularly, when an electrical signal is sent (e.g., a logical high) from burn-in driver 40 to one or more of device-specific terminals 16 semiconductor device 10 is operable, upon receiving the electrical signal, to perform the indicated burn-in function. In the embodiment shown in FIG. 6, device under test 3 is operable upon receiving a logical high on Burn-In Terminal to perform a full burn-in routine (e.g., functions 122–126 of FIG. 2). Thus, burn-in functions can be initiated either by sending an instruction to a JTAG port or by sending an electrical signal to one or more device-specific terminal 16. As neither of these methods for indicating to the semiconductor device that a burn-in is to be performed requires the use of a data input terminal, there is no need to electrically couple any of data input terminals 15 to burn-in driver 40.

Figure 6:
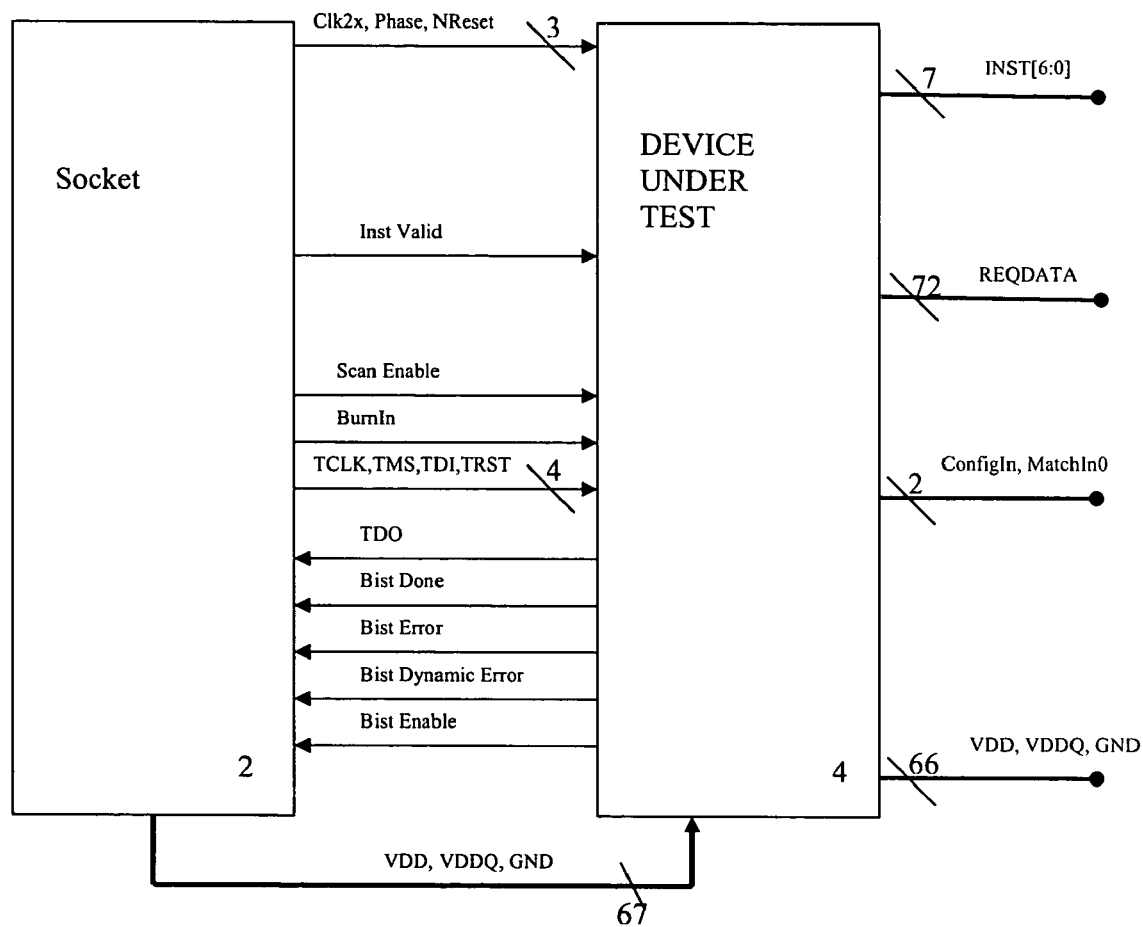
FIG. 6 is a diagram that illustrates the electrical connections between a socket having a reduced pin count and a device under test in accordance with one embodiment of the present invention.

FIG. 6 illustrates a specific embodiment in which the device under test 4 (e.g., semiconductor device 10 and package 20 of FIG. 5) are coupled to a socket 2 which is an 82 pin socket. In this embodiment the device under test is a CAM device that includes a memory array that normally receives input via 72 memory array data input contacts (REQDATA) that are not electrically connected to socket 2. Some of the power contacts (VDD, VDDQ), and some of the ground contacts (GND) are shown to not be electrically connected to socket 2.

JTAG pins include test clock input (TCLK), test mode select (TMS), test data input (TDI), test reset input (TRST) and test data output (TDO) pins that couple to corresponding JTAG contacts on device under test 4. In this embodiment, device-specific pins of socket 2 that are connected to device under test 4 include system clock signal pin (Clk2*x*), phase pin (Phase), system reset pin (NReset), Inst Valid pin (Inst Valid), scan enable pin (Scan Enable), burn-in pin (Burnin), built-in self test done pin (Bist Done), built-in self test error pin (Bist Error), built-in self test dynamic error pin (Bist Dynamic Error) and built-in self test enable pin (Bist Enable). Also, 67 of a total of 133 power (VDD, VDDQ) and ground (GND) pins are coupled to corresponding contacts of device under test 4.

In one embodiment the interconnects shown in FIG. 6 provide a common burn-in platform. More particularly, a burn-in board is provided that includes a reduced pin-count socket that includes the pins indicated in FIG. 6. More particularly, the reduced-pin-count-socket includes device-specific pins, JTAG pins, power pins and ground pins. The 'pin-out' on different packaged semiconductor devices is altered (either by altering the package or by altering the design of the semiconductor device itself) such that each packaged semiconductor device includes contacts that couple to each to each JTAG pin, to at least some of the device-specific pins, and to at least some of the power pins (VDD, VDDQ) and at least some of the ground pins (GND). The burn-in board is then used to perform burn-in of each of the different packaged semiconductor devices.

As there is no need to connect to all of the power terminals on each packaged semiconductor device, the "pin out" of each packaged semiconductor device only needs to be altered to the extent necessary to provide enough common power terminals to operate the self-test and burn-in operations of that particular semiconductor device. Similarly, as there is no need to connect to all of the ground terminals on each packaged semiconductor device, the "pin out" of each packaged semiconductor device only needs to be altered to the extend necessary to provide enough common ground terminals to operate the self-test and burn-in operations of the particular semiconductor device.

Different semiconductor devices may have different requirements for performing self-test and burn-in. Accordingly, it may not be necessary to connect to all of the device-specific terminals indicated in FIG. 6. Accordingly, the "pin out" of each packaged semiconductor device only needs to be altered to the extend necessary to provide enough common device-specific terminals to conduct self-test and burn-in operations on that particular semiconductor device. Moreover, many of the device-specific terminals are dual-purpose terminals. That is, they perform one function during normal operation of the semiconductor device and they perform a different function during testing and burn-in (e.g., when a logical high is sent to built-in self test enable pin). Accordingly, in most cases altering the semiconductor device or the package to provide the necessary common device-specific contacts will not interfere with the 'pin out' required for normal operation of the semiconductor device.

In the present embodiment burn-in of each different packaged semiconductor device is performed in the same manner as in FIGS. 1–6. More particularly, each different packaged semiconductor devices is inserted into a socket on the burn-in board and a pre-test is performed. The burn-in board is then coupled to a burn-in driver that sends an indication that a burn-in is to be performed while the burn-in board is heated. This indication can be an instruction sent over a JTAG pin or can be an electrical signal sent over or more of the device-specific pins (e.g., a logical high sent over the burn-in pin).

The present invention allows for each different semiconductor device to have a different 'pin out' according to the needs of that particular type of semiconductor device or family of semiconductor device. However, each semiconductor device will include sufficient common contacts (device-specific contacts, power contacts and ground contacts) such that burn-in can be accomplished using a common burn-in board design. The use of a common burn-in board design will allow for burn-in boards to be purchased in bulk, resulting in significant cost savings. Moreover, there is no need to design a new burn-in board configuration for each new product, eliminating the engineering design time required to produce a new burn-in board.

Figure 7:
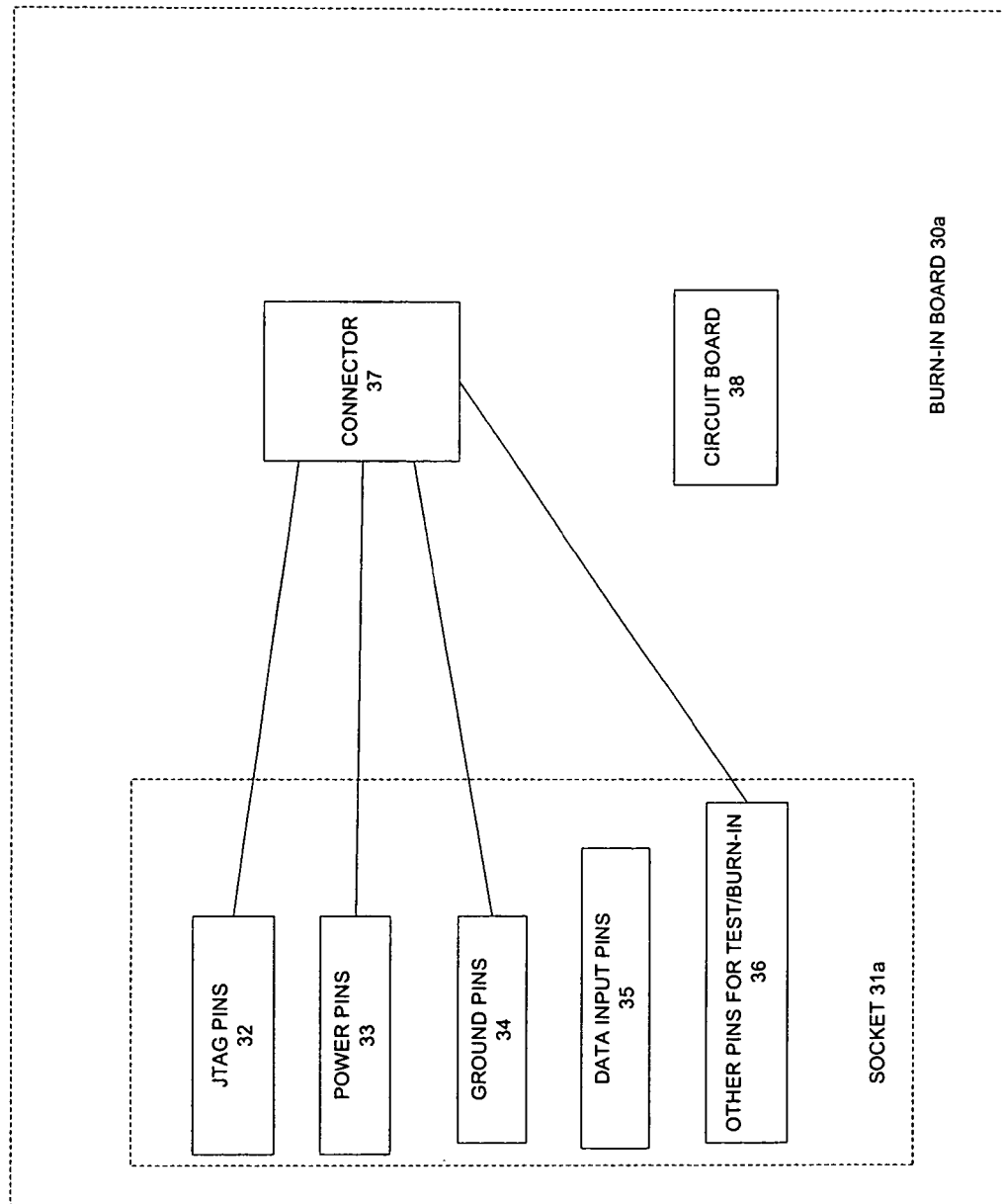
FIG. 7 is a diagram that illustrates a burn-in board that includes a socket and a connector that is not electrically coupled to the data input pins of the socket in accordance with one embodiment of the present invention.
Figure 8:
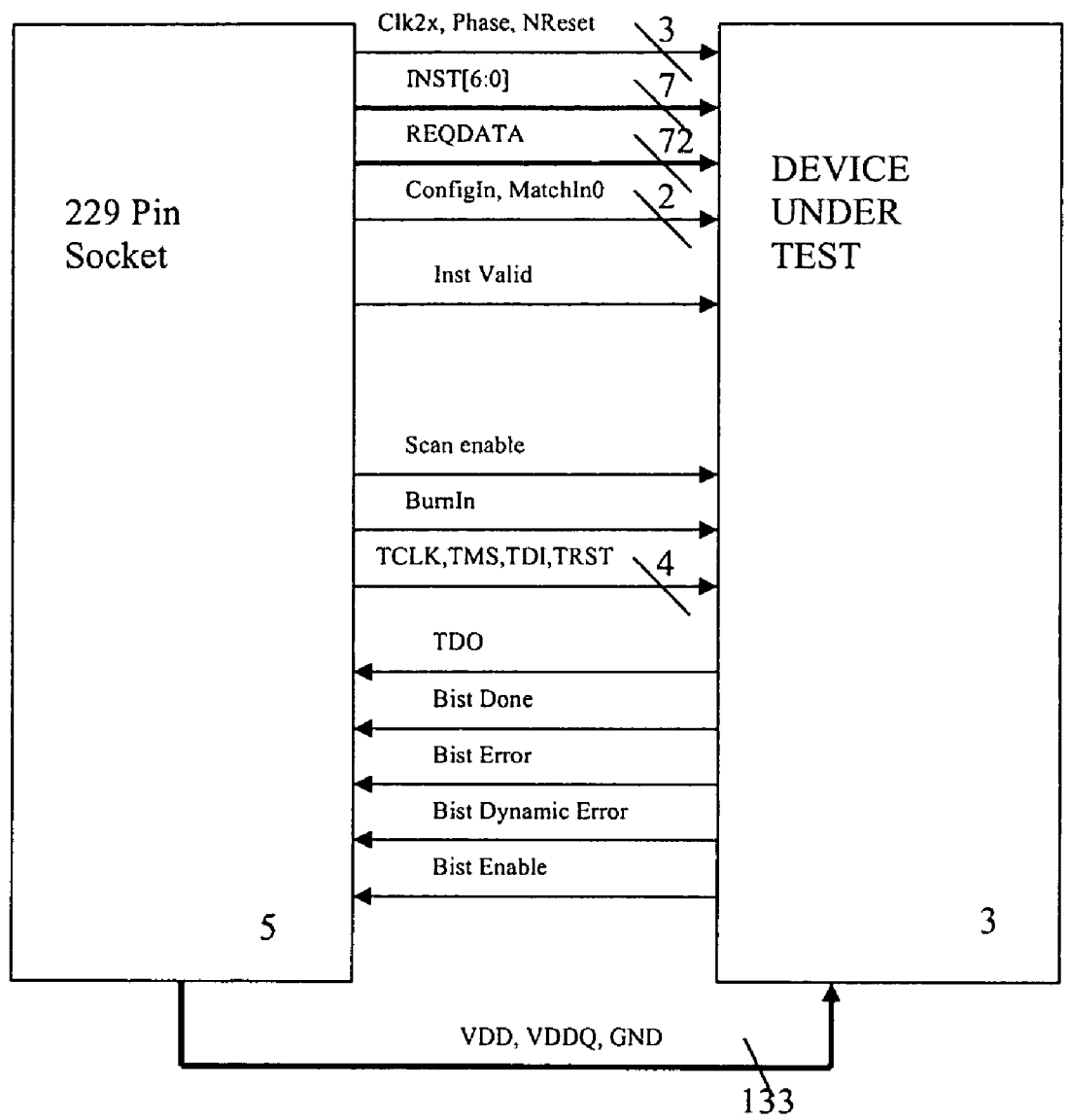
FIG. 8 is a diagram that illustrates the embodiment of FIG. 7 and that shows the electrical connections between an exemplary socket and an exemplary device under test in accordance with one embodiment of the present invention.

In the embodiment shown in FIGS. 3–6, only those locations within socket 31 that are required for testing and burn-in are populated with pins. However, it may be desirable to fully populate socket 31 with pins. FIGS. 7–8 illustrate an alternate embodiment in which socket 31 is fully populated with pins. In this embodiment socket 30a is electrically connected (shown in FIG. 8 as 72 REQDATA connections) to the data input terminals of the device under test 3. However, as semiconductor 10 and method 400 do not require that any signals be sent to data input terminals 15 of the device under test, there is no need to connect those pins that couple data input terminals 15 to connector 37. Accordingly, in the present embodiment, those pins that couple to data input terminals 15, shown as data input pins 35 are not electrically coupled to connector 37. This can be accomplished by not including electrical traces on socket 31 that connect to data input pins 35 and connect to connector 37.

The method and apparatus of the present invention do not require that any data be transmitted through data input terminals of the semiconductor device under test. Thus, no electrical contact is required between the burn-in board and the data input terminals of the device under test. Accordingly, the burn-in process of the present invention is not constrained by the size of the memory array of the device under test. Thus the apparatus and method of the present invention allows for burn-in of devices that include large memory arrays. Furthermore, significant cost savings are realized as reduced pin-count sockets can be used. In addition, as electrical contact is required with fewer pins than are required in prior art processes, reliability is improved.

The preferred embodiment of the present invention is thus described. While the present invention has been described in particular embodiments, it should be appreciated that the present invention should not be construed as limited by such embodiments, but rather construed according to the following claims.

What is claimed is:

1. A semiconductor device comprising:
    a memory array that includes memory cells, registers and mask cells;
    data input terminals electrically coupled to the memory cells;
    JTAG terminals; and
    circuitry electrically coupled to the JTAG terminals and operable upon receiving an instruction through one of the JTAG terminals to perform a full burn-in routine of the memory array in which a zero and a one are written to each memory cell, a zero and a one are written to each register, a zero and a one are written to each mask cell, a horizontal stripe pattern is written to the memory cells, a horizontal stripe-bar pattern is written to the memory cells and a lookup loop is performed so as to cause alternating match lines to match and not match.

2. A semiconductor device as recited in claim 1 wherein the circuitry includes built-in self test circuitry and wherein the semiconductor device includes a plurality of device-specific terminals, the built-in self test circuitry operable upon receiving a signal through one of the device-specific terminals to perform a full burn-in routine of the memory array in which a zero and a one are written to each memory cell, a zero and a one are written to each register a zero and a one are written to each mask cell, a horizontal stripe pattern is written to the memory cells, a horizontal stripe-bar pattern is written to the memory cells and a lookup loop is performed so as to cause alternating match lines to match and not match.

3. A semiconductor device as recited in claim 1 wherein the memory array is a Content Addressable Memory array.

4. A semiconductor device as recited in claim 1 wherein no data is required to be transmitted through the data input terminals in order for the circuitry to perform the full burn-in routine.

5. A semiconductor device as recited in claim 1 wherein the JTAG terminals comprise a test data input terminal, a test data output terminal, a test reset input terminal, a test mode select terminal and a test clock input terminal.

6. A semiconductor device as recited in claim 1 wherein said circuitry performs a full burn-in routine upon receipt of a single instruction through one of said JTAG terminals.

7. A method for performing burn-in comprising:
    coupling a semiconductor device that includes JTAG terminals, test circuitry and a memory array having memory cells, registers and mask cells to a burn-in board;

heating the semiconductor device and the burn-in board; and sending an instruction to one of the JTAG terminals while the semiconductor device and the burn-in board are heated, the test circuitry operable upon receiving the instruction to perform a full burn-in function routine of the memory array in which a zero and a one are written to each memory cell, a zero and a one are written to each register, a zero and a one are written to each mask cell, a horizontal stripe pattern is written to the memory cells, a horizontal stripe-bar pattern is written to the memory cells and a lookup loop is performed so as to cause alternating match lines to match and not match.

8. A method as recited in claim 7 wherein the semiconductor device includes a plurality of data input terminals, and wherein no data is required to be transmitted through the data input terminals in order to write data to the memory cells.

9. A method as recited in claim 7 wherein the semiconductor device includes a plurality of device-specific terminals, the semiconductor device operable upon receiving a signal through one of the device-specific terminals to perform a full burn-in routine of the memory array in which a zero and a one are written to each memory cell, a zero and a one are written to each register, a zero and a one are written to each mask cell, a horizontal stripe pattern is written to the memory cells, a horizontal stripe-bar pattern is written to the memory cells and a lookup loop is performed so as to cause alternating match lines to match and not match.

10. A method as recited in claim 7 wherein the JTAG terminals include a test data input terminal and wherein the instruction is transmitted to the test data input terminal.

11. A method as recited in claim 7 further comprising coupling the burn-in board to a burn-in driver, and wherein the burn-in driver is operable to send the instruction to one of the JTAG terminals.

12. The method as recited in claim 7 wherein the semiconductor device comprises a Content Addressable Memory (CAM).

\* \* \* \* \*

UNITED STATES PATENT AND TRADEMARK OFFICE
CERTIFICATE OF CORRECTION

| | |
|---|---|
| PATENT NO. | : 7,275,188 B1 |
| APPLICATION NO. | : 10/683205 |
| DATED | : September 25, 2007 |
| INVENTOR(S) | : Sobaiti et al. |

It is certified that error appears in the above-identified patent and that said Letters Patent is hereby corrected as shown below:

Column 8, line 42 the word "Burnin" should read --BurnIn--.

Claim 6, line 2 "said" should read --the--.

Claim 6, line 3 "said" should read --the--.

Claim 7, line 11 "burn-in function routine" should read --burn-in routine--

Signed and Sealed this

Fourth Day of December, 2007

JON W. DUDAS
*Director of the United States Patent and Trademark Office*